United States Patent [19]

Haque et al.

[11] Patent Number: 4,533,876
[45] Date of Patent: Aug. 6, 1985

[54] DIFFERENTIAL OPERATIONAL AMPLIFIER WITH COMMON MODE FEEDBACK

[75] Inventors: Yusuf Haque, San Jose, Calif.; Erwin Ofner, Graz, Austria

[73] Assignee: American Microsystems, Inc., Santa Clara, Calif.

[21] Appl. No.: 543,194

[22] Filed: Oct. 18, 1983

[51] Int. Cl.³ .......................... H03F 3/16; H03F 3/45
[52] U.S. Cl. ................................... 330/253; 330/277
[58] Field of Search ................ 330/253, 277, 293, 294

[56] References Cited

U.S. PATENT DOCUMENTS

| | | | |
|---|---|---|---|
| 3,559,193 | 1/1971 | Savaglio et al. | 340/213 |
| 3,991,380 | 11/1976 | Pryor | 330/253 |
| 4,283,683 | 8/1981 | Main | 330/262 |
| 4,320,347 | 3/1982 | Haque | 330/253 X |
| 4,393,347 | 7/1983 | Looper | 324/126 |
| 4,429,416 | 1/1984 | Page | 455/211 |
| 4,450,368 | 5/1984 | Spence | 307/362 |
| 4,460,873 | 7/1984 | Hester | 330/259 |

*Primary Examiner*—James B. Mullins
*Assistant Examiner*—Steven J. Mottola
*Attorney, Agent, or Firm*—Steven F. Caserza; Alan H. MacPherson; Kenneth E. Leeds

[57] ABSTRACT

A differential operational amplifier is provided with a feedback loop which continuously adjusts the common mode voltage level of the amplifier so that it lies in the center of the dynamic range of the amplifier. The feedback loop measures the instantaneous common mode voltage level and compares it with a reference voltage which is set to reflect the desired common mode voltage. An error signal is generated and fed back into the amplifier to adjust the instantaneous common mode voltage level towards the reference level. Frequency compensation is also provided to overcome the phase shift introduced by the use of RC networks.

11 Claims, 5 Drawing Figures

DIFFERENTIAL OPERATIONAL AMPLIFIER WITH COMMON MODE FEEDBACK

This invention relates to a differntial operational amplifier fabricated with MOS transistors and, more particularly, relates to a fully differential operational amplifier with common mode feedback.

Operational amplifiers are high-gain amplifiers capable of amplifying DC signals or AC signals up to frequencies of many megahertz. Historically, operational amplifiers were used in the early days of analog computers and were fabricated from vacuum tubes. When bipolar transistors became available, they were used to produce operational amplifiers with higher gains and at less expense. Many variations and designs of operational amplifiers have occurred using bipolar building blocks. See, e.g., M. Tobey, et al (eds.), "Operational Amplifiers: Design and Applications", 1971; and "Differential and Operational Amplifiers", Manual 3 in *Electronic Circuit Design With Solid-State Devices* (McGraw-Hill, 1978). Until recently, most operational amplifiers were fabricated using bipolar technology.

The rapid increase in chip complexity which has occurred recently has created the need to implement complete analog-digital subsystems on the same integrated circuit using the same technology. Since digital devices have been made readily in MOS devices, it has now happened that analog functions, of the same type as previously were fabricated with bipolar components, have begun to be widely fabricated in MOS technology. See, e.g., D. A. Hodges, et al, "Potential of MOS Technologies for Analog Integrated Circuits", *IEEE J. Solid-State Circuits*, pp. 285–293, June 1978.

The fabrication of analog components in MOS technology has necessarily involved the fabrication of MOS operational amplifiers since operational amplifiers are an integral building block of analog components. See, P. R. Gray, et al, "MOS Operational Amplifier Design—A Tutorial Overview", *IEEE J. Solid-State Circuits*, V. SC-17, p. 969 (December 1982). For many applications, the basic building block, a single-ended operational amplifier, is replaced by a differential operational amplifier which amplifies the difference between two input signals and provides them as a difference between two output signals. This is shown in simplified schematic form in FIG. 2. Thus, in the prior art MOS structure of FIG. 2, two inputs are provided, respectively, to the gates of transistors 20 and 21. The difference between the values impressed on these two gates is supplied after amplification as the difference between the two outputs supplied on lines 27 and 28. An explanation of the operation of this differential operational amplifier is available in P. R. Gray, et al., supra, at p. 979.

Differential operational amplifiers previously fabricated in MOS technology have provided high-speed operation and positive and negative outputs. However, due to the nature of MOS processing, the electrical properties of individual MOS transistors are allowed to vary over a specified range. Thus, the threshold voltage, $V_{th}$, of an individual MOS transistor, may to vary from about 0.8 volts to about 1.5 volts and yet be within allowable limits. Similarly, the mobilities may vary within a range, and resistances may vary between certain limits. Specific values will vary from wafer to wafer and across an individual wafer. Thus, a fully satisfactory transistor according to the process specification may have electrical properties that may be found anywhere within this range. As a consequence, it has been found that differential operational amplifiers fabricated in MOS technology have had common mode voltages which vary appreciably. These common mode voltages are defined as that component of the signal which is common to both outputs, e.g., that component which is common to each output of the signal present on lines 27 and 28 of the prior art example given above. For example, the signal present on output 27 may have a common mode voltage of 1 volt and a differential mode signal to $SinW_ct$. The signal present on output line 28 then would have a common mode voltage of also 1 volt and a differential mode signal of $-SinW_ct$. For both output signals $W_c$ is the frequency of the AC signal in radians/sec. Variations in common mode voltage have severely limited the useful dynamic range of such differential operational amplifiers. This is undesirable since a wide dynamic range typically enlarges the utility of an operational amplifier. By definition, the dynamic range is the range of operation between the smallest detectable signal and the level at which a specified distortion occurs. If the common mode voltage varies as described above, then for a given amplifier on a particular chip on a particular wafer, the common mode voltage may cause the output voltage swing to clip at one end of the power supply (say the positive supply) while having a larger swing in the opposite direction. However, dynamic range is lost by this because, the signal swing would have to be reduced to eliminate clipping on the one side of the power supply. Prior art operational amplifiers also had poor power supply rejection. See, for example, Y. A. Haque "Design Techniques for Dynamic Range Improvement in CMOS Circuitry", Proceedings of the 1983 Custom Integrated Circuits Conference, p. 376.

It is therefore an object of the present invention to provide a differential operational amplifier circuit fabricated with MOS transistors wherein the common mode voltage level is maintained at the center of the dynamic range.

It is another object of the present invention to provide frequency compensation for the common mode voltage in a fully differential operational amplifier.

It is yet another object of the present invention to provide a fully differential operational amplifier from MOS components whose operation is rendered independent of process variations.

It is still another object of the present invention to provide a differential operational amplifier from MOS components in combination with a feedback circuit which compares the instantaneous common mode voltage level with a reference voltage and feeds back the error voltage into the amplifier to maintain the common mode at the reference level.

BRIEF DESCRIPTION OF THE DRAWINGS

For a more complete understanding of the differential operational amplifier of the present invention, reference may be had to the accompanying drawings which are incorporated herein by reference and in which.

SUMMARY

Figure 1:
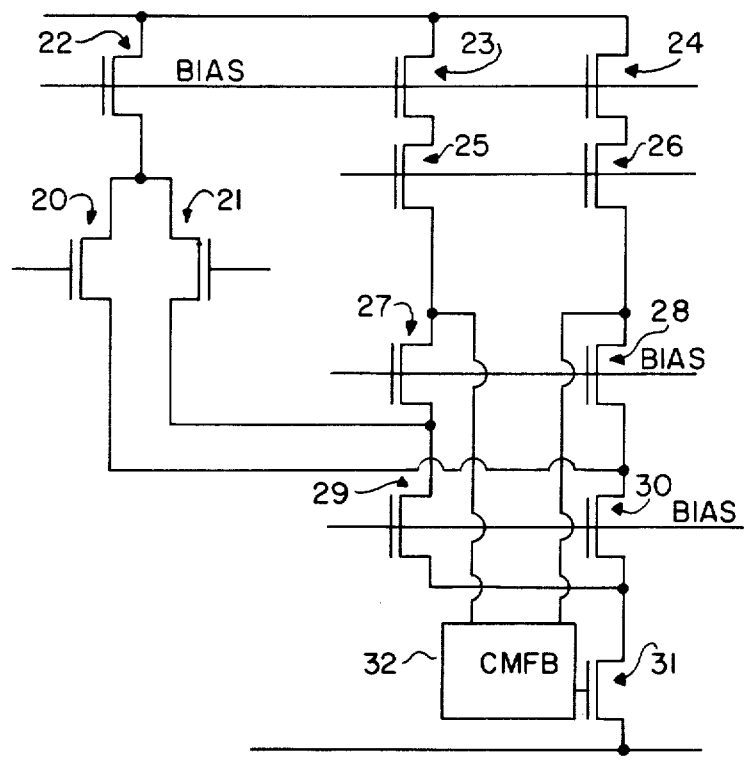
FIG. 1 is a circuit schematic of a differential operational amplifier of the prior art fabricated with MOS components.

A fully differential operational amplifier is provided with a feedback loop which measures the instantantaneous common mode voltage level. The instantantaneous common mode voltage level is compared with a reference voltage which is set to reflect the common mode level which would typically be in the center of the dynamic range for the normal operation of the operational amplifier. An error signal is generated by the comparison. The error signal is fed back into the amplifier to adjust the common mode voltage level towards the reference level. Since a phase shift is introduced by the use of RC networks, the common mode voltage requires frequency compensation. Frequency compensation is provided by capacitive means.

DESCRIPTION OF THE PREFERRED EMBODIMENTS

Standard differential operational amplifiers are widely used in such applications as active filtering and signal processing. Fully differential input and output operational amplifiers (a positive and a negative output in addition to a positive and negative input is available) are beginning to be used in industry. See for example D. Sendenowicz, et al., "Differential NMOS Analog Building Blocks for PCM Telephony", Proceeding, ISSCC 1982, p. 38. For these operational amplifiers the magnitude of the common mode voltage on the two outputs does not affect gross operation of the device because the signal processing is done differentially and since the magnitude of the common mode voltage is similar on both outputs, they cancel out. However, the absolute value of common mode voltage does adversely affect the available dynamic range of the device. It is important that the device provide a wide dynamic range to preserve all signal information. In addition, when such differential operational amplifiers are fabricated in low-voltage MOS technology, it is essential that they operate in a manner that is not overly sensitive to power supply noise, and it is preferred that the differential operational amplifiers not be particularly affected by variations in processing which lead to variations in the electrical properties of individual transistors. These objectives are met in the differential operational amplifier of the present invention which utilizes a continuous feedback loop. The need for such a feedback loop has been stated in the prior art but no solutions have been advanced. See, e.g. P. R. Gray, et al., "MOS Operational Amplifier Design—A Tutorial Overview", IEEE J. of Solid-State Circuits V-SC-17, No. 6, p. 979, December 1982. The problem with using a feedback circuit has been the difficulty of making commonmode output voltage independent of the differential mode signal voltage. This is accomplished in the present invention by incorporating a comparison means to compare the instantaneous common mode voltage with a reference voltage and generate an error signal based on the difference between the two voltages and introduce the error signal into the amplifier which adjusts the operation of the amplifier to shift the common mode voltage level to the reference level which may be arbitrarily chosed.

Figure 3:
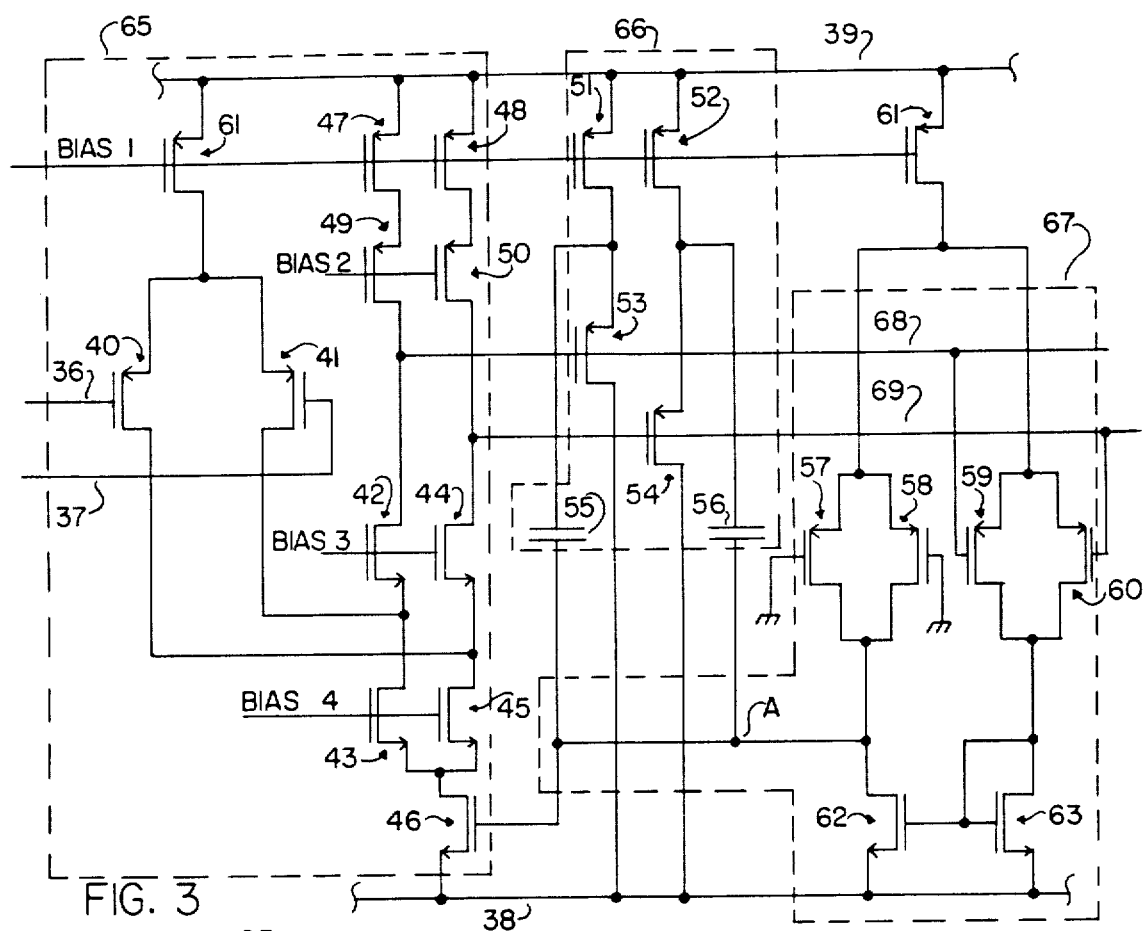
FIG. 3 is a circuit schematic of the differential operational amplifier of the present invention fabricated with p-channel MOS transistors.

As seen in FIG. 3, the differential operational amplifier of the present invention consists of three functional groups 65, 66 and 67. The front end designated within dotted line 65 is an MOS differential operational amplifier of the prior art. See, for example, P. R. Gray, et al, "MOS Operational Amplifier Design—A Tutorial Overview", IEEE J. of Solid-State Circuits, V. SC-17, No. 6, pp. 969, 979, especially FIG. 23 (December 1982). The transistors are all MOS transistors with the arrows pointing in towards the gate signifying p-channel transistor and the arrows pointing out away from the gate signifying n-channel transistors. As seen, the embodiment of FIG. 3 is principally a p-channel embodiment. The operation of this amplifier is as follows. An input of one polarity, e.g., positive, is applied to the gate of MOS transistor 40 on line 36; an input of opposite polarity is applied to the gate of MOS transistor 41 on line 37. The current through these two transistors is provided through transistor 61 having its gate controlled by a first fixed DC level designated BIAS 1. All BIAS levels are generated on chip from the power supplies avalable on chip using well-known techniques. Selection of particular levels will be a matter of design choice in accordance with the operating parameters desired for the operational amplifier. The differential currents are supplied, respectively, to the sources of transistor 42 and 44. The gates of transistors 42 and 44 are controlled by a DC bias designated BIAS 3. Amplification is obtained using transistors 42 and 44 as a cascode device and transistors 47-50 as a load device. The cascode device simply prevents appreciable voltage gain on the source of transistor 42, 44 which would otherwise increase the Miller multiplied gate to drain capacitance of transistors 40, 41. The voltage on the drain of transistor 44 serves as the negative output of the amplifier which is delivered externally on output line 69; the voltage on the drain of transistor 42 serves as the positive output of the amplifier and is delivered externally on line 68. The currents through transistors 42 and 44 flow into the bottom supply line 38 through transistor 46 and; respectively, through transistors 43 and 45. The fixed DC bias designated BIAS 4 on the gates of transistors 43 and 45 will control the current and therefore the output voltages and the gain of the amplifier. The fixed DC bias level designated BIAS 2 on the gates of transistors 49 and 50 also controls the current.

The third stage of the differential operational amplifier of the present invention, shown within the dotted line 67, is the feedback circuit which measures the voltages on output lines 68 and 69 and makes a comparison with an internally-generated reference voltage. This internally-generated reference is designed to be at the midpoint of the expected dynamic range. (For example, if the voltage of line 39 is +5 volts, and the voltage of line 38 is −5 volts, the internally generated reference voltage could be 0 volts). The operation of feedback circuit 67 is as follows. The positive output line 68 is connected to the gate of transistor 59. The negative output line 69 is connected to the gate of transistor 60. The currents in 59, 60 will vary proportionally to the magnitudes of the voltage on the output lines 68 and 69. Since the output voltages comprise a signal component superimposed upon the common mode voltage, the signal component will cancel out because the polarities of the signal voltages impressed on the two transistor gates are opposite. Thus, the coupled drains will allow current proportional to the sum of the common mode voltages on the output lines 68 and 69 to flow. The summed currents pass through transistor 63 to a supply voltage line. The current through transistor 63 is mirrored through transistor 62 since the gate to source voltages of 62 and 63 are identical. Transistors 57 and 58 have their gates connected to a fixed reference level, shown to be ground, but in practice will be an on-chip voltage source, which will be set to represent the desired common mode voltage. Devices 57, 58, 59, 60, 61, 62, 63 behave as a differential amplifier amplifying the difference of the sum of the common mode voltage (on the gates of 59, 60) and the sum of the reference voltage (on the gates of 57, 58). In implementation transistors 57, 58, 59, 60 are designed to be of identical geometry. Also, transistors 62 and 63 are also identical in geometry. The amplified difference between the common mode voltage and the reference voltage is impressed on node A and is thereby supplied to the gate of transistor 46. In the prior art, a fixed voltage would have been used on this transistor. However, with the present invention the voltage difference on node A represents an error signal which is communicated to the gate of transistor 46 on an error signal feedback line and controls the current through transistor 46, thereby adjusting the bias current in the two legs consisting of transistors 46, 43, 42, 49 and 47 and transistors 46, 45, 44, 50 and 48, respectively, so that the common mode voltage appearing on output lines 68 and 69 will track the desired common mode voltages, i.e., the reference voltage available on the gates of transistors 57 and 58. The first string which produces the positive output voltage consists of transistors 46, 43, 42, 49 and 47. The second string which produces the negative output voltage consists of transistors 46, 45, 44, 50 and 48. If the error signal is positive, signifying that the common mode voltage is higher than the reference voltage, then the voltage on the gate of transistor 46 is high, allowing more current to flow through the transistors in the two strings so that the common mode voltage is lowered. If the error signal is negative, signifying that the common mode voltage is lower than the reference voltage, then the voltage impressed on the gate of transistor 46 is lowered so that less current is passed through the two strings and the common mode voltage is increased.

Figure 5:
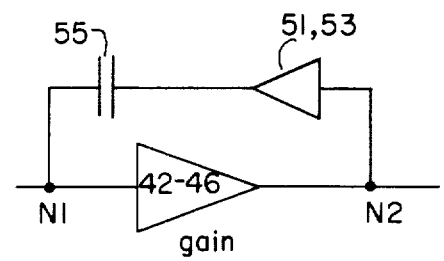
FIG. 5 is a circuit schematic of a circuit equivalent of the frequency compensation stage 66 shown in FIG. 3.

The second stage is shown within dotted line 66. It provides frequency compensation which is required because a phase shift is introduced by the feedback circuit 67 consisting of transistors 57 to 63. Also, the gain through transistors 46, 43, 45, 42 and 49 introduces a further phase shift. Frequency compensation is required to maintain negative feedback stability. The need for such frequency compensation is recognized in J. D. Graeme, ed; *Operational Amplifiers*, pp. 165–166 (1971). Frequency compensation is accomplished by using capacitors 55 and 56. Transistors 51 and 53 serve to buffer the signal on the gate of transistor 53. The output of this buffer is fed to capacitor 55. The other end of capacitor 55 goes to the gate of transistor 46. Transistors 42 to 46 serve to amplify the signal on the gate of 46. Thus capacitors 55 and 56 become Miller multiplied by the gain and serve as the dominanat poles. The buffer is needed to prevent feed forward of the frequency compensated signal. This may be seen in the generalized schematic diagram of FIG. 5 where the transistors 51 and 53 isolate capacitor 55 from the gain section consisting of transistors 42 through 46. A similar buffering function is performed by transistors 52 and 54 which isolate capacitor 56 from the gain section consisting of transistors 48, 50, 44, 45 and 46. By using the two buffers only the frequency response of the common mode feedback loop is affected; the frequency response of the differential operational amplifier, shown within dotted line 65, is not affected.

Figure 2:
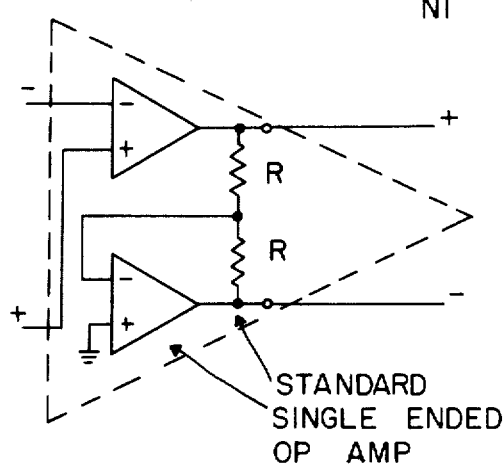
FIG. 2 is the circuit equivalent of the differential operational amplifier of FIG. 1.
Figure 4:
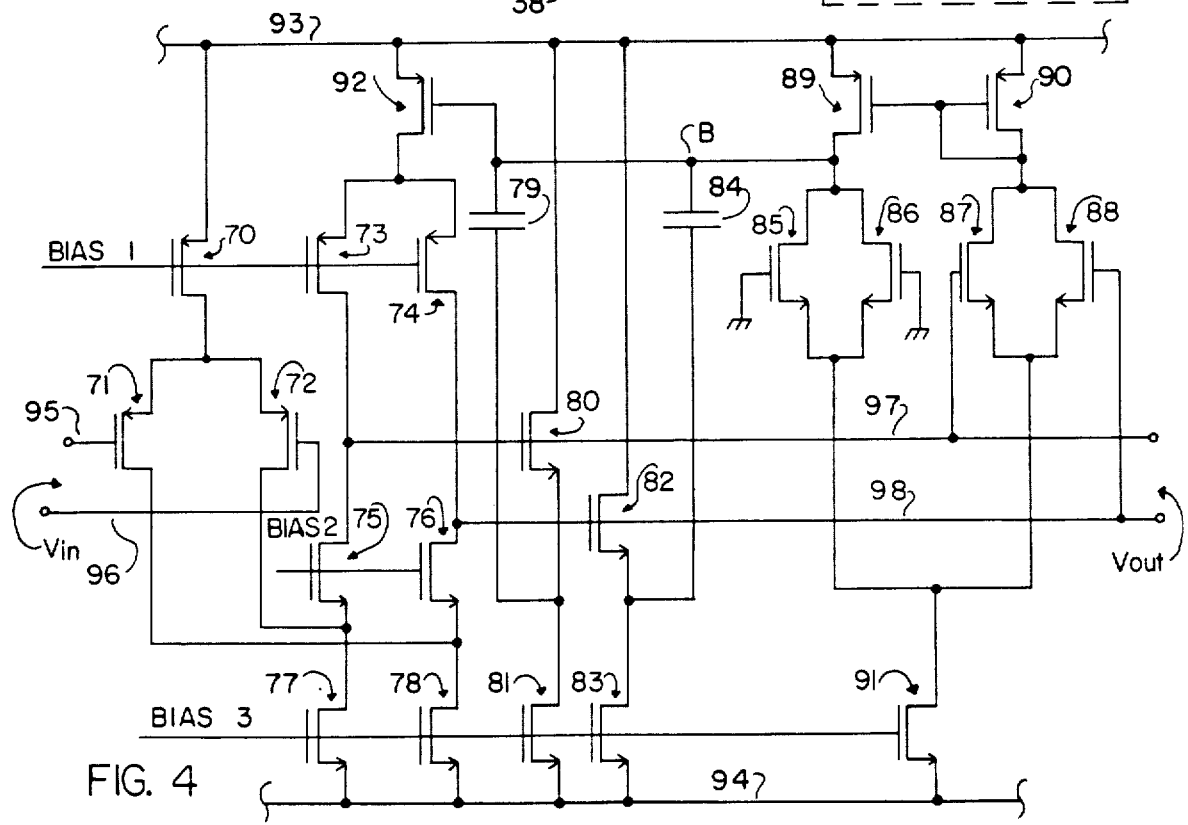
FIG. 4 is a differential operational amplifier of the present invention fabricated with n-channel MOS transistors.

An alternate embodiment of the differential operational amplifier of the present invention is shown in FIG. 4. The structure and operation of the circuit is analogous to that of the embodiment of FIG. 3. Here, n-channel transistors replace the p-channel transistors of FIG. 2 except for certain of the input transistors which remain as p-channel transistors. As with FIG. 3 there are functional groups—the MOS differential operational amplifier, the feeback circuit and the frequency compensation circuit. These circuits are now described, although they are not highlighted as in FIG. 3. In the differential operational amplifier, differential input voltages are supplied, respectively, on lines 95 and 96 to the gates of p-channel transistors 71 and 72. The sources of transistors 71 and 72 are connected together and tied to the drain of transistor 70 whose gate is controlled by a fixed voltage designated BIAS 1 and whose source is connected to the supply line 93. The drain of transistor 71 is tied to the connection between the source of transistor 76 on the drain of transistor 78. The drain of transistor 72 is tied to the connection between the source of transistor 75 and the drain of transistor 77. The current through these two transistors is provided through p-channel transistor 70 having its gate controlled by a first fixed DC level designated BIAS 1 and having its source connected to voltage supply line 93. The differential currents are supplied, respectively, to the sources of n-channel transistors 75 and 76. The gates of transistors 75 and 76 are controlled by a DC bias designated BIAS 2. The voltage on the drain of transistor 76 serves as the negative output of the amplifier which is delivered externally on output line 98; the voltage on the drain of transistor 75 serves as the positive output of the amplifier and is delievered externally on line 97. The currents through transistors 75 and 76 flow into the bottom supply line 94, respectively, through transistors 77 and 78. The fixed DC bias designated BIAS 3 on the gates of transistors 77 and 78 will control the current and therefore the output voltages and the gain of the amplifier. The fixed DC bias level designated BIAS 1 on the gates of transistors 73 and 74 also controls the current.

The feedback circuit of the embodiment of FIG. 4 comprises transistors 85–91 and operates as follows. The voltages on output lines 97 and 98 are measured and compared with an internally-generated reference voltage. This internally-generated reference is designed to be at the midpoint of the expected dynamic range of the common mode voltages of the outputs. The positive output line 98 is connected to the gate of transistor 88. The negative output line 97 is connected to the gate of transistor 87. The currents in transistors 87 and 88 will vary proportionally to the magnitudes of the voltages on the output lines 97 and 98. Since the output voltages contain a signal component superimposed upon the common mode voltage, the signal component will cancel out because the polarities of the signal voltages impressed on the two transistor gates are opposite. Thus, the coupled drains will allow current proportional to the sum of the common mode voltages on the output lines 97 and 98 to flow. The summed currents pass through transistor 90 to the supply voltage line 93. The current through transistor 90 is mirrored through transistor 89 since the gate to source voltages of transistors 90 and 89 are identical. Transistors 85 and 86 have their gates connected to a fixed reference level, shown to be ground, but can be an on-chip voltage source, which could be set to represent the desired common mode voltage. Transistors 85-91 therefore function as a differential amplifier amplifying the difference of the sum of the common mode voltages impressed on the gates of transistors 87 and 88 and the sum of the reference voltages impressed on the gates of transistors 85 and 86. Transistors 85 through 88 are designed in a preferred embodiment to be of identical geometry. Also, transistors 89 and 90 are identical in geometry in the preferred embodiment. The amplified difference between the common mode voltage and the reference voltage is impressed on node B and is thereby supplied to the gate of transistor 92. In the prior art, a fixed voltage would have been used on this transistor. However, with the present invention the voltage difference on node B represents an error signal which controls the current through transistor 92 and thus adjusts the bias current in the two strings consisting of transistors 92, 74, 76 and 78 and of transistors 92, 73, 85 and 77. Thus, the common mode voltage appearing on output lines 97 and 98 will track the desired common mode voltages, i.e., the reference voltage available on the gates of transistors 85 and 86. The first string which produces the positive output voltage consists of transistors 92, 74, 76 and 78. The second string which produces the negative output voltage consists of transistors 92, 73, 75 and 77. If the error signal is negative, signifying that the common mode voltage is lower than the reference voltage, then the voltage on the gate of transistor 92 is low, allowing more current to flow through the transistors in the two strings so that the common mode voltage is raised. If the error signal is positive, signifying that the common mode voltage is higher than the reference voltage, then the voltage impressed on the gate of transistor 46 is higher so that less current is passed through the two strings and the common mode voltage is reduced.

Frequency compensation is provided for the feedback circuit to compensate for phase shift introduced by transistors 85 to 91, and also by transistors 92, 73, 74, 75 and 76. Frequency compensation is required to maintain negative feedback stability. The need for such frequency compensation is recognized in J. D. Graeme, ed; *Operational Amplifiers,* pp. 165-166 (1971). Frequency compensation is accomplished by using capacitors 79 and 84. Transistors 80 to 83 serve to buffer the output signals 97, 98. The output of this buffer is fed to capacitor 79, 84. The other end of capacitor 79, 84 goes to the gate of transistor 92. Transistors 92 and 73-76 serve to amplify the signal on the gate of transistor 92. Thus capacitors 79 and 84 become Miller multiplied by the gain and serve as the dominant poles. The buffer is needed to prevent feed forward of the frquency compensated signal. A similar buffering function is performed by transistors 83 and 82 which isolate capacitor 84 from the gain section consisting of transistors 92, 74, 76 and 78. By using the two buffers only the frequency response of the common mode feedback loop is affected; the frequency response of the differential operational amplifier, described above, is not affected.

Throughout this specification the terms source and drain have been used to describe particular electrical regions of the MOS transistors. Generally, in a particular embodiment the regions designated source can e used interchangeably with those regions designated drain providing a complete substitution is carried out.

We claim:

1. A differential operational amplifier having automatic means for controlling common mode output voltage levels, comprising:
   a differential operational amplifier for receiving two input signals and amplifying the difference, said operational amplifier having two input lines for receiving said two input signals and having two output lines for presenting the amplified difference between said two input signals;
   a feedback circuit connected to said two output lines of said differential operational amplifier, said feedback circuit including means for generating a reference voltage representative of the desired common mode feedback voltage, and further including means for comparing the instantaneous common mode voltage on said output lines with said reference voltage, the difference between said desired common mode voltage and said instantaneous common mode voltage constituting an error signal, said error signal being communicated on a feedback line to the differential operational amplifier to adjust the instantaneous common mode voltage towards the desired common mode voltage; and
   frequency compensation means in electrical communication with said feedback circuit and said differential operational amplifier to allow said error signal to possess negative feedback stability.

2. A differential operational amplifier in accordance with claim 1 wherein said feedback circuit comprises:
   a first pair of MOS transistors having their sources connected to each other and to a first supply voltage line, the gates of said first pair of transistors being connected respectively to said two output lines of said differential operational amplifier, the drains of said first pair of transistors being connected together, the voltage on said drains having a value representative of the sum of the common mode voltage appearing on said two output lines;
   a second pair of MOS transistors having their sources connected together and to said first supply voltage line, the gates of each of said second pair of transistors being connected to a fixed voltage level which is representative of a desired common mode voltage level, the drains of each of said second pair of transistors being connected together, the voltages of said drains having a value of twice times the reference value for the common mode voltage; and
   current mirror means for receiving the current from said drains of said first pair of MOS transistors and mirroring the current from said drains of said first pair of transistors to the drains of said second pair of transistors;
   whereby the difference between said voltage on said drains of said first pair of MOS transistors and the voltage on said sources of said second pair of MOS transistors constitutes said error signal.

3. A differential operational amplifier in accordance with claim 2 wherein said sources of said first pair of MOS transistors are connected to said first supply voltage line through a current supply transistor and wherein said sources of said second pair of MOS transistors are connected to said supply voltage line through said current supply transistors.

4. A differential operational amplifier in accordance with claim 2 wherein said sources of said first and second pairs of MOS transistors are connected to said first supply voltage line through the same current supply transistor.

5. A differential operational amplifier in accordance with claim 2 wherein said first and second pair of MOS transistors comprise n-channel transistors.

6. A differential operational amplifier in accordance with claim 2 wherein said first and second pairs of MOS transistors comprise p-channel transistors.

7. A differential operational amplifier in accordance with claim 6 wherein the transistors in said differential operational amplifier and in said frequency compensation circuit are also p-channel transistors.

8. A differential operational amplifier in accordance with claim 2 wherein the gates of each of said second pair of MOS transistors are connected to ground.

9. A differential operational amplifier in accordance with drain 2 wherein said current mirror means comprises a first MOS transistor having its drain connected to the coupled drains of said first pair of MOS transistors and a second MOS transistor having its drain connected to the coupled drains of said second pair of MOS transistors, the sources of said first and second MOS transistors being connected to a second voltage supply line, the gates of said first and second MOS transistors being interconnected.

10. A differential operational amplifier in accordance with claim 2 wherein said frequency compensation means comprises:
- a third MOS transistor whose gate is tied to one of said two output lines and whose source is connected to said first voltage supply line;
- a fourth MOS transistor whose gate is connected to the other of said two output lines and whose source is connected to said first voltage supply line;
- a first capacitor connected between the source of said third MOS transistor and an error signal feedback line; and
- a second capacitor connected between the source of said second transistor and the source of said error signal feedback line.

11. A differential operational amplifier in accordance with claim 10 wherein the drains of said third and fourth MOS transistors are connected to said first voltage supply line through fifth and sixth MOS transistors, respectively, the gates of said fifth and sixth MOS transistors being connected to a fixed DC voltage bias level.

* * * * *